United States Patent [19]

Okamura et al.

[11] Patent Number: 5,665,682
[45] Date of Patent: Sep. 9, 1997

[54] METHOD OF MANUFACTURING AN OXIDE SUPERCONDUCTOR WITH HIGH CRITICAL CURRENT DENSITY

[75] Inventors: Osamu Okamura; Atsushi Kume; Yuh Shiohara, all of Tokyo, Japan

[73] Assignees: International Superconductivity Technology Center, Tokyo; The Kansai Electric Power Co., Inc., Osaka; Fujikura Ltd., Tokyo, all of Japan

[21] Appl. No.: 514,731

[22] Filed: Aug. 14, 1995

Related U.S. Application Data

[62] Division of Ser. No. 407,036, Mar. 17, 1995, abandoned, which is a continuation of Ser. No. 79,757, Jun. 22, 1993, abandoned.

[30] Foreign Application Priority Data

Jun. 22, 1992 [JP] Japan ................. 4-163168

[51] Int. Cl.$^6$ .................. B05D 5/12; B05D 3/02
[52] U.S. Cl. .................. 505/446; 505/445; 505/510; 505/734; 427/62; 427/226
[58] Field of Search .................. 505/446, 500, 505/445, 734, 510; 427/62, 226

[56] References Cited

PUBLICATIONS

Siegrist et al, Mater. Res. Soc. Symp. Proc., 169 (1990) pp. 691–693.
Amemiya et al, Journal of the Japan Society of Power and Power Metallurgy, vol. 37, No. (5), Jul. 1990, pp. 188–191.
Ramesh et al, Appl. Phys. Lett. 57(14) Oct. 1990, pp. 1458–1460.
Oh et al, Appl. Phys. Lett. 51(11) Sep. 1987 pp. 852–854.
Tong et al, Appl. Phys. Lett. 55(3), Jul. 1989, pp. 286–288.
Hamdi et al, J. Mater. Res. 3(6), Nov./Dec. 1988, pp. 1311–1316.
Kanamori et al, Journal of the Ceramic Society of Japan 101(6), Jun. 1993, pp. 687–692.

*Primary Examiner*—Roy V. King
*Attorney, Agent, or Firm*—Oblon, Spivak, McClelland, Maier & Neustadt, P.C.

[57] ABSTRACT

An oxide superconductor capable of realizing a high critical current density and its manufacturing method requiring only a low temperature heat treatment. An oxide superconductor has a superconductive layer with a composition of $RE_1Ba_2Cu_3O_{7-x}$, where RE stands for any one of rare earth elements including Y, Eu, Gd, Dy, Ho, Er, and Yb, which is formed on the substrate by $RE_1Ba_2Cu_3O_{7-x}$ phase and CuO phase resulting from a decomposition of $RE_1Ba_2Cu_4O_8$ phase, in which the CuO phase and micro-defects caused by the decomposition function as pinning centers. This superconductive layer is formed by applying a solution containing organic compounds of a plurality of metallic elements for constituting the oxide superconductive layer; calcining the substrate applied with the solution to obtain a calcined body in which the organic compounds contained in the solution are thermally decomposed; heating the calcined body to produce $RE_1Ba_2Cu_4O_8$ phase; and decomposing the $RE_1Ba_2Cu_4O_8$ phase into $RE_1Ba_2Cu_3O_{7-x}$ phase and CuO phase, to obtain the oxide superconductor.

14 Claims, 4 Drawing Sheets

| MEASURED TEMPERATURE (K) | CRITICAL CURRENT DENSITY Jc (A/cm²) (0 TESLA) | |
|---|---|---|
| | SAMPLE 1 (PRESENT INVENTION) | SAMPLE 2 (CONVENTIONAL) |
| 87 | 4700 | 400 |
| 77 | 18000 | 2000 |
| 67 | 25000 | 5300 |
| 57 | 30000 | 8400 |

METHOD OF MANUFACTURING AN OXIDE SUPERCONDUCTOR WITH HIGH CRITICAL CURRENT DENSITY

This is a Division of application Ser. No. 08/407,036 filed on Mar. 17, 1995, which is a Continuation of Ser. No. 08/079,757 filed on Jun. 22, 1993, both of them abandoned.

BACKGROUND OF THE INVENTION

1. Field of the Invention

The present invention relates to an oxide superconductor in which a superconductive layer in a thin or thick film shape is formed on a substrate, and its manufacturing method.

2. Description of the Background Art

Conventionally known methods of manufacturing an oxide superconductor such as YBaCuO type superconductor include a sputtering method and a vacuum evaporation method. In these conventionally known methods, it is fairly common to have the composition of the obtained thin film to be somewhat different from the composition of the target or the evaporation source employed, so that the control of the composition of the oxide superconductor which includes at least three metallic elements presents unexpectedly difficult problem.

In addition, these conventionally known methods are not suitable for the thick film formation as well as for the mass production, so that they are disadvantageous for the manufacturing of a large area superconductor.

Moreover, in the thin film obtained by these conventionally known methods, it is possible to obtain the satisfactory crystal orientation property so that the sufficiently high critical temperature Tc and critical current density Jc can be realized, but it is difficult to form a thick film of a desired thickness without sacrificing this crystal orientation property.

On the other hand, there is another conventionally known method of manufacturing an oxide superconductor called the CVD (Chemical Vapor Deposition) method. This CVD method is suitable for the mass production, and has a possibility of realizing a low temperature film formation.

However, in this CVD method, there is a drawback concerning the difficulty to secure the sufficient amount of the necessary alkali metal materials including Ba materials and Sr materials at the appropriate vapor pressure in particular.

There has also been a proposition of a potentially superior method of manufacturing an oxide superconductor called the MOD (Metal-Organic Deposition) method. This MOD method uses a solution in which organometallic complex salts of a plurality of metallic elements to constitute the oxide superconductor are dissolved in an organic solvent, to form a superconductive layer on a substrate by applying this solution on a surface of the substrate and then burning it.

This MOD method has advantages in that it is easy to form a large area superconductor and a superconductive layer of desired thickness and film formation pattern can be manufactured. However, there is a drawback in this MOD method in that it is difficult to obtain an oxide superconductor with a high critical current density.

Now, in any of these conventionally known methods of manufacturing an oxide superconductor, there is an unavoidable problem of realizing a sufficiently high critical current density in a form of a thick film such as a tape member. However, in any of these conventionally known methods, when the film is thickened to a level of a tape member, the critical current density inevitably decreases.

In addition, it has been difficult in any of these conventionally known methods to control the thickness of the film while maintaining a desired superconductor property.

In order to resolve these problems of conventionally known methods, there has been a proposition to raise the critical current density by introducing pinning centers for suppressing movements of magnetic fluxes which are entering into the oxide superconductor at a time of current conduction.

Here, the pinning centers are portions which function to obstruct the movements of the magnetic fluxes due to the Lorentz's force exerted onto the magnetic fluxes entering into the superconductor which would generate the resistances in the superconductor, and it is known that this role of the pinning centers can be fulfilled by deposit particles or grain boundaries formed within the oxide superconductor.

Conventionally, as a method of introducing the pinning centers to the balky oxide superconductor with the composition of $Y_1Ba_2Cu_3O_{7-x}$, there is a method which incorporates the $Y_2Ba_1Cu_1O_x$ phase into the $Y_1Ba_2Cu_3O_{7-x}$ phase by utilizing the peritectic reaction from a state in which the $Y_2Ba_1Cu_1O_x$ phase and the liquid phase are mixedly present.

However, in this method, in order to introduce the $Y_2Ba_1Cu_1O_x$ phase, there is a need to use a high temperature heat treatment with a temperature over 1000° C. However, when such a high temperature heat treatment is applied with respect to the oxide superconductive layer formed on the substrate, the diffusion reaction at a boundary surface between the substrate and the superconductive layer is promoted, such that the composition of the oxide superconductive layer itself is affected and as a result the lowering of the critical current density is caused.

Also, a conventional method of manufacturing a balky oxide superconductor includes a process for introducing the pinning centers by utilizing the decomposition process from the $Y_1Ba_2Cu_4O_8$ phase to the mixture of the $Y_1Ba_2Cu_3O_{7-x}$ phase and the CuO phase, but this decomposition process requires the high temperature heat treatment with a temperature over 900° C. under the usual ambient atmosphere with a significant oxygen partial pressure, so that it is difficult to utilize this decomposition process in the method of manufacturing an oxide superconductor on a substrate.

SUMMARY OF THE INVENTION

It is therefore an object of the present invention to provide an oxide superconductor capable of realizing a high critical current density along with a desired thickness and a superconductor property.

It is another object of the present invention to provide a method of manufacturing such an oxide superconductor with a high critical current density, capable of introducing a pinning center by utilizing the decomposition process from the $Y_1Ba_2Cu_4O_8$ phase to the mixture of the $Y_1Ba_2Cu_3O_{7-x}$ phase and the CuO phase, which only requires a heat treatment of a temperature significantly lower than that required in the conventional method.

According to one aspect of the present invention there is provided an oxide superconductor, comprising: a substrate; and a superconductive layer with a composition of $RE_1Ba_2Cu_3O_{7-x}$, where RE stands for any one of rare earth elements including Y, Eu, Gd, Dy, Ho, Er, and Yb, which is formed on the substrate by $RE_1Ba_2Cu_3O_{7-x}$ phase and CuO phase resulting from a decomposition of $RE_1Ba_2Cu_4O_8$ phase, in which the CuO phase and micro-defects caused by the decomposition function as pinning centers.

According to another aspect of the present invention there is provided a method of manufacturing an oxide superconductor, comprising the steps of: (a) applying a solution containing organic compounds of a plurality of metallic elements for constituting an oxide superconductive layer with a composition of $RE_1Ba_2Cu_3O_{7-x}$ onto a substrate;. (b) calcining the substrate applied with the solution to obtain a calcined body in which the organic compounds contained in the solution are thermally decomposed; (c) heating the calcined body to produce $RE_1Ba_2Cu_4O_8$ phase; and (d) decomposing the $RE_1Ba_2Cu_4O_8$ phase into $RE_1Ba_2Cu_3O_{7-x}$ phase and CuO phase, to obtain the oxide superconductor having the superconductive layer formed on the substrate, where the CuO phase and micro-defects caused by this decomposing step are introduced into the superconductive layer as pinning centers.

Other features and advantages of the present invention will become apparent from the following description taken in conjunction with the accompanying drawings.

DETAILED DESCRIPTION OF THE PREFERRED EMBODIMENTS

Figure 1:
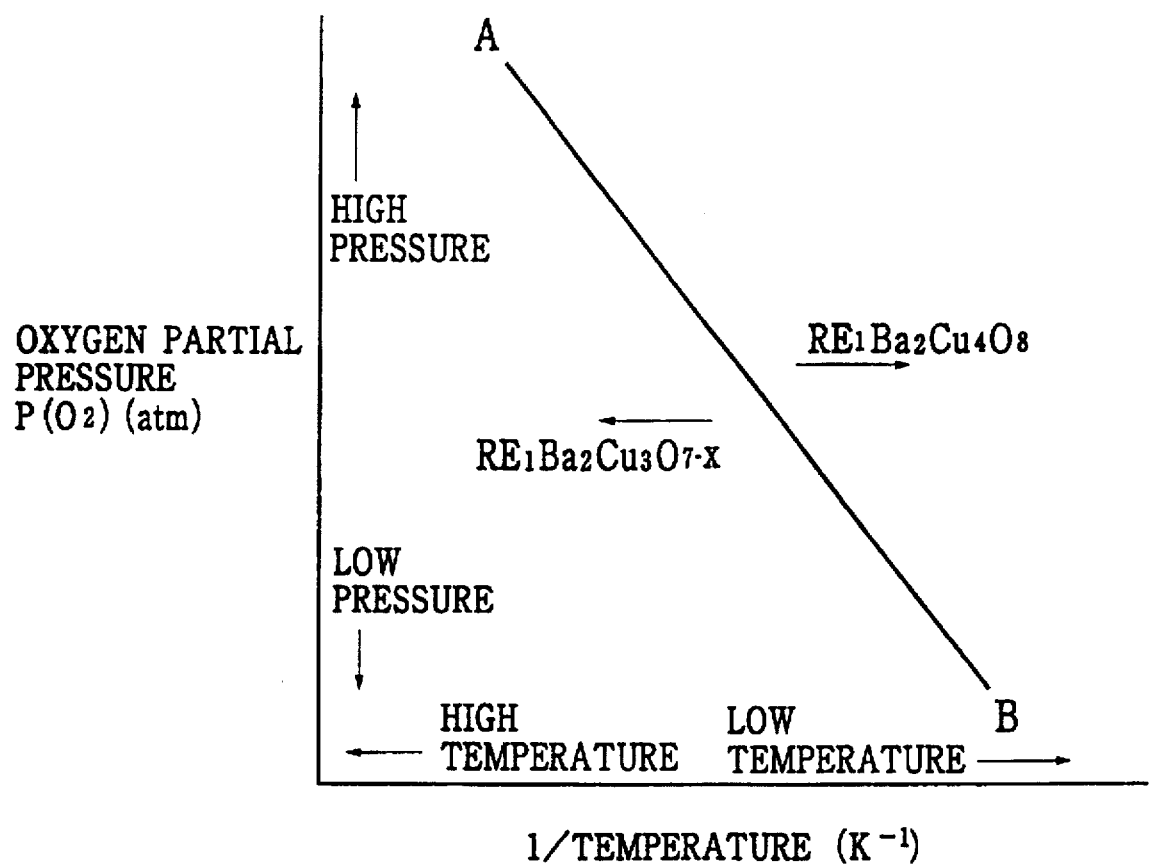
FIG. 1 is a graph of an oxygen partial pressure versus an inverse of temperature, for indicating thermodynamically stable regions for $RE_1Ba_2Cu_4O_8$ phase and the $RE_1Ba_2Cu_3O_{7-x}$ phase in the method of manufacturing an oxide superconductor according to the present invention.

First, the oxide superconductor and its manufacturing method according to the present invention will be outlined in general terms.

Namely, the oxide superconductor according to the present invention has a superconductive layer with a composition of $RE_1Ba_2Cu_3O_{7-x}$, where RE stands for any one of the rare earth elements including Y, Eu, Gd, Dy, Ho, Er, and Yb, which is formed on a substrate by decomposing the $RE_1Ba_2Cu_4O_8$ phase into the $RE_1Ba_2Cu_3O_{7-x}$ phase and CuO phase such that the CuO phase and micro-defects caused by the decomposition process function as pinning centers.

In this oxide superconductor according to the present invention, the CuO phase and the micro-defects introduced by the decomposition process function as the pinning centers to obstruct the movements of the magnetic fluxes entering into the superconductor due to the self-excitation at a time of current conduction through the superconductive layer, so that the critical current density of the superconductor can be improved.

In addition, these CuO phase and micro-defects are produced by the decomposition of the $RE_1Ba_2Cu_4O_8$ phase, so that they can be distributed uniformly over the entire superconductive layer. As a consequence, the pinning effects due to the pinning centers can be obtained uniformly from the entire superconductive layer, such that it is possible to exhibit the effect of the improved critical current density efficiently.

Now, according to the manufacturing method according to the present invention, the above described oxide superconductor according to the present invention can be obtained by the following procedure.

Namely, the superconductive layer is formed on the substrate from the solution containing organic compounds of a plurality of metallic elements for constituting the oxide superconductor with a composition of the $RE_1Ba_2Cu_3O_{7-x}$ which is applied onto the substrate, calcined to thermally decompose the organic salts, and heated to produce the $RE_1Ba_2Cu_4O_8$ phase, where the produced $RE_1Ba_2Cu_4O_8$ phase is then decomposed into the $RE_1Ba_2Cu_3O_{7-x}$ phase and CuO phase such that the CuO phase and the micro-defects caused by this decomposition process function as the pinning centers.

In this manufacturing method, the $RE_1Ba_2Cu_4O_8$ phase is produced by applying the solution to the substrate first and then heating it, so that the $RE_1Ba_2Cu_4O_8$ phase can be produced on the substrate uniformly.

In addition, in this manufacturing method, the CuO phase and the micro-defects are obtained from this $RE_1Ba_2Cu_4O_8$ phase by the decomposition process, so that they can be distributed uniformly over the entire superconductive layer, and consequently it is possible to manufacture the oxide superconductor with the improved critical current density.

Moreover, in this manufacturing method, the oxide superconductor of a desired thickness can be manufactured as a thickness of the solution applied onto the substrate can be easily adjusted by appropriately controlling the viscosity of the solution and selecting the manner of application.

Here, in the manufacturing method described above, before a calcined body is heated to produce the $RE_1Ba_2Cu_4O_8$ phase, the calcined body should preferably be heated at the temperature in a range of 700° to 850° C. under the ambient atmosphere of the purely inert gas or the inert gas with a low oxygen partial pressure, corresponding to the thermodynamically stable region for the $RE_1Ba_2Cu_3O_{7-x}$ phase in the starting composition, to produce the $RE_1Ba_2Cu_3O_6$ phase and the CuO phase, so as to ensure the production of the $RE_1Ba_2Cu_4O_8$ phase by the further heat treatment.

In this case, it is also possible to produce the $RE_1Ba_2Cu_3O_6$ phase to be c-axis oriented in a direction vertical with respect to the surface of the substrate, in order to obtain the c-axis oriented $RE_1Ba_2Cu_4O_8$ phase. This procedure to obtain the c-axis oriented $RE_1Ba_2Cu_4O_8$ phase from the c-axis oriented $RE_1Ba_2Cu_3O_8$ phase and the CuO phase is effective because the $RE_1Ba_2Cu_4O_8$ phase is highly unlikely to be c-axis oriented compared with the $RE_1Ba_2Cu_3O_8$ phase, so that when the $RE_1Ba_2Cu_4O_8$ phase is directly produced from the calcined body by the heat treatment, it is likely to obtain crystal grains in random orientations. It is to be noted here that it is preferable for the superconductive layer to be c-axis oriented because the superconductor currents flows in parallel to the surface of the substrate of the superconductor which is located on an ab-plane.

It is to be noted here that the heating of the calcined body at the temperature below the above described range is not preferable as it will result in the incomplete decomposition of $BaCO_3$ produced by the thermal decomposition of the organic salts. On the other hand, the heating of the calcined body at the temperature above the above described range is also not preferable as it will cause the diffusion reaction among the elements constituting the substrate and the elements, constituting the solution.

Also, in this case, the further heat treatment to produce the $RE_1Ba_2Cu_4O_8$ phase from the $RE_1Ba_2Cu_3O_6$ phase and the CuO phase should preferably be made at the temperature in a range of 700° to 850° C. under the appropriate ambient atmosphere, corresponding to the thermodynamically stable region for the $RE_1Ba_2Cu_4O_8$ phase in the starting composition, so as to produce the $RE_1Ba_2Cu_4O_8$ phase stably and efficiently. Here, as indicated in FIG. 1, the $RE_1Ba_2Cu_4O_8$ phase becomes stable at the lower temperature side than the $RE_1Ba_2Cu_3O_{7-x}$ phase, so that the further heat treatment can be made at the temperature and the ambient atmosphere in the thermodynamically stable region for the $RE_1Ba_2Cu_4O_8$ phase in the starting composition by appropriately selecting the oxygen partial pressure and the temperature in the starting composition to be in the thermodynamically stable region for the $RE_1Ba_2Cu_4O_8$ phase. Note here that a location of a straight line A–B indicated in FIG. 1 moves according to the starting composition.

Furthermore, in the manufacturing method described above, the decomposition of the $RE_1Ba_2Cu_4O_8$ phase into the $Re_1Ba_2Cu_3O_{7-x}$ phase and CuO phase should preferably be achieved by the heating at the temperature in a range of 700° to 850° C. under the ambient atmosphere of the purely inert gas or the inert gas with a low oxygen partial pressure, corresponding to the thermodynamically stable region for the $RE_1Ba_2Cu_3O_{7-x}$ phase in the starting composition, in order to thermally decompose the $RE_1Ba_2Cu_4O_8$ phase into the $RE_1Ba_2Cu_3O_{7-x}$ phase and CuO phase efficiently. Here, as indicated in FIG. 1 described above, the $RE_1Ba_2Cu_3O_{7-x}$ phase becomes stable at the higher temperature side than the $RE_1Ba_2Cu_4O_8$ phase, so that this heating for the thermal decomposition of the $RE_1Ba_2Cu_4O_8$ phase into the $RE_1Ba_2Cu_3O_{7-x}$ phase and CuO phase can be made at the temperature and the ambient atmosphere in the thermodynamically stable region for the $RE_1Ba_2Cu_3O_{7-x}$ phase in the starting composition by appropriately selecting the oxygen partial pressure and the temperature in the starting composition to be in the thermodynamically stable region for the $RE_1Ba_2Cu_3O_{7-x}$ phase. In this case, it is further preferable to make this heating at as low temperature side as possible in order to prevent the grain boundary deposition of the CuO phase.

Figure 2:
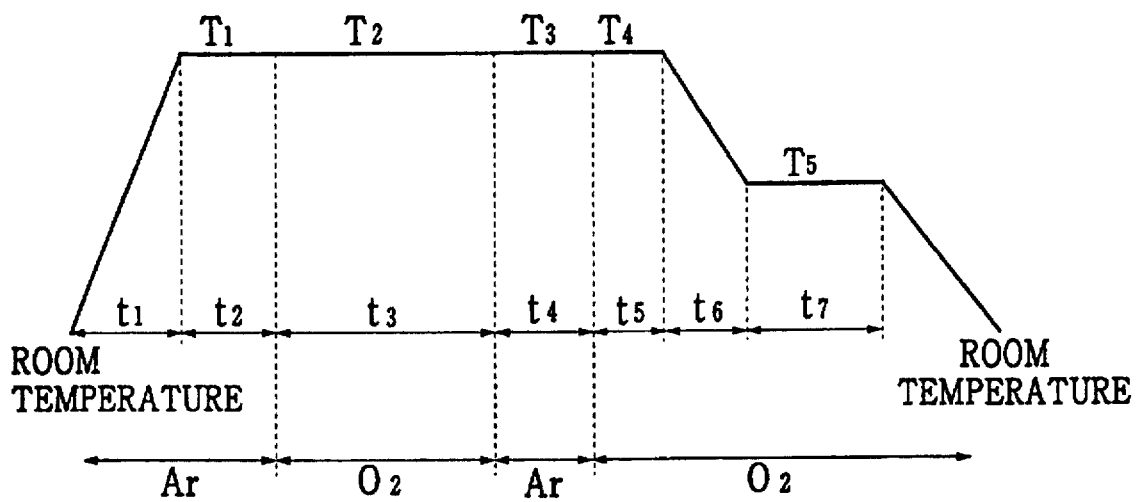
FIG. 2 is a general timing chart for a multi-stage heat treatment to be carried out in the method of manufacturing an oxide superconductor according to the present invention.

Referring now to FIG. 2, one specific embodiment of the method of manufacturing an oxide superconductor according to the present invention summarized above will be described in detail.

First, the substrate is prepared. Here, the substrate may be in any desired shape such as that of a plate, a wire, or a tape. It is preferable for this substrate to be made from a material with a high melting point which does not easily make the diffusion reaction with the elements constituting the oxide superconductive layer to be formed thereon, or a material having a crystalline structure similar to that of the oxide superconductive layer. More specifically, a monocrystalline substrate of strontium titanate ($SrTiO_3$) or magnesium oxide (MgO), or a metallic substrate having a monocrystalline covering of either one of these can be used for this substrate, for example.

Next, the solution to be applied to this substrate is prepared. As already mentioned above, this solution contains organic compounds of a plurality of metallic elements for constituting the oxide superconductor with a composition of the $RE_1Ba_2Cu_3O_{7-x}$.

Here, the organic compounds to be contained in this solution may includes Y acetylacetone complex salt $[Y(acac)_3]$ where "acac" stands for acetylacetonato: $CH_3COCHCOCH_3$ ($C_5H_7O_2$), Ba acetylacetone complex salt $[Ba(acac)_2(OH_2)_2]$, and Cu acetylacetone complex salt $[Cu(acac)_2]$ for example. The organic compounds may also includes other acetylacetone complex salt such as Er tri-acetylacetonato complex salt $[Er(acac)_3]$, as well as other organometallic compounds such as formate, acetate, naphthenate, etc.

The solution can be prepared from these organic compounds by mixing the powders of these organic compounds at a predetermined mole ratio such that a relative rate of RE (rare earth) element, Ba element, and Cu element in the mixture becomes 1:2:3.1 to 4, respectively, and then dissolving the obtained mixture into the organic solvent.

Here, the organic solvent can be a mixed solvent of pyridine (Py) and propionic acid (PA) for example, or a solvent of methanol, acetic acid, toluene, etc.

Next, the solution is applied onto the surface of the substrate. Here, the manner of application can be any of the known solution application method such as the spin coating method, the screen printing method, the brushing method, and the dip coating method.

Next, the entire substrate with the solution applied thereon is confined in a furnace such as a muffle furnace, to calcine it at the temperature of 500° to 700° C. in the air, so as to thermally decompose the organic salts contained in the solution. As a result of this thermal decomposition, the calcined body containing the oxides of the elements contained in the solution such as $RE_2O_3$, $BaCO_3$, and CuO is produced.

Next, the multi-stage heat treatment is applied to this calcined body in the furnace by appropriately controlling the temperature and the atmosphere inside the furnace according to the timing chart shown in FIG. 2, as follows.

First, the air inside the furnace is replaced by the inert gas such as the 100% argon gas or the argon gas containing about 0.01% of oxygen, and the temperature inside the furnace is raised to the temperature T1 in a range of 700° to 850° C. under the appropriate ambient atmosphere, corresponding to the thermodynamically stable region for the $RE_1Ba_2Cu_3O_{7-x}$ phase in the starting composition, over the period t1 in a range of several tens of minutes to several hours. Then, these temperature T1 and ambient atmosphere are maintained for the following period t2 in a range of several tens of minutes to several hours.

As a result of this heat treatment, the solvent components in the solution are evaporated, and the organic components in the solution are sufficiently decomposed to produce the $RE_1Ba_2Cu_3O_6$ phase and the CuO phase. At this stage, as the oxygen is not supplied from the ambient atmosphere, the $RE_1Ba_2Cu_3O_6$ phase is mainly produced. Also, the CuO phase is deposited at portions centered around the grain boundaries.

Next, the temperature inside the furnace is set and maintained at the temperature T2 in a range of 700° to 850° C. while the oxygen partial pressure inside the furnace is increased by supplying oxygen gas into the furnace, so as to realize the temperature and the ambient atmosphere corresponding to the thermodynamically stable region for the $RE_1Ba_2Cu_4O_8$ phase in the starting composition, over the period t3 in a range of several tens of minutes to several tens of hours. In the temperature and the ambient atmosphere corresponding to the thermodynamically stable region for the $RE_1Ba_2Cu_4O_8$ phase in the starting composition, the $RE_1Ba_2Cu_3O_6$ phase and the CuO phase at the grain boundaries react each other to produce the $RE_1Ba_2Cu_4O_8$ phase, so as to realize the phase state of a mixture of the $RE_1Ba_2Cu_4O_8$ phase, the $RE_1Ba_2Cu_3O_6$ phase, and the CuO phase. At this stage, as the oxygen gas is supplied from the ambient atmosphere, the $RE_1Ba_2Cu_3O_6$ phase is believed to be actually in a form of $RE_1Ba_2Cu_3O_{6.0-7.0}$.

Here, as already mentioned above, the $RE_1Ba_2Cu_4O_8$ phase is highly unlikely to be c-axis oriented compared with the $RE_1Ba_2Cu_3O_6$ phase, so that when the $RE_1Ba_2Cu_3O_8$ phase is directly produced from the calcined body by the heat treatment, it is likely to obtain crystal grains in random orientations. In contrast, in the procedure described above, by producing the $RE_1Ba_2Cu_3O_6$ phase to be c-axis oriented in a direction vertical with respect to the surface of the substrate first, and then obtaining the $RE_1Ba_2Cu_4O_8$ phase from the c-axis oriented $RE_1Ba_2Cu_3O_6$ phase and the CuO phase, it is possible to secure the production of the c-axis oriented $RE_1Ba_2Cu_4O_8$ phase.

Next, the temperature inside the furnace is set and maintained at the temperature T3 in a range of 700° to 850° C. while the oxygen partial pressure inside the furnace is decreased by supplying argon gas into the furnace, so as to realize the temperature and the ambient atmosphere of the inert gas such as the 100% argon gas or the argon gas containing about 0.01% of oxygen, corresponding to the thermodynamically stable region for the $RE_1Ba_2Cu_3O_{7-x}$ phase in the starting composition, over the period t4 in a range of several tens of minutes to several hours. In the temperature and the ambient atmosphere corresponding to the thermodynamically stable region for the $RE_1Ba_2Cu_3O_{7-x}$ phase in the starting composition, the $RE_1Ba_2Cu_4O_8$ phase is thermally decomposed into the $RE_1Ba_2Cu_3O_{7-x}$ phase and CuO phase.

Next, the temperature inside the furnace is set and maintained at the temperature T4 in a range of 700° to 850° C. while the oxygen partial pressure inside the furnace is increased by supplying oxygen gas into the furnace, over the period t5 in a range of several tens of minutes to several hours, during which period the oxygen is supplied from the ambient atmosphere to the $RE_1Ba_2Cu_3O_{7-x}$ phase.

Next, the temperature inside the furnace is slowly decreased to the temperature T5 in a range of 400° to 500° C. under the same ambient atmosphere over the period t6 in a range of several tens of minutes to several hours. Then, these temperature T5 and ambient atmosphere are maintained for the following period t7 in a range of several hours to several tens of hours, such that the crystal structure of the complex oxide having a composition of $RE_1Ba_2Cu_3O_{7-x}$ formed in the superconductive layer can be changed from the tetragonal structure to the rhombic structure during this period t7. As a result, the desired oxide superconductor which shows the superconductivity at approximately 90K can be produced. It is noted here that, the crystal structure can be changed from the tetragonal structure to the rhombic structure by taking the oxygen atoms into the crystal structure, so that a number of carriers is increased in the rhombic structure and the desired superconductivity characteristics can be realized.

Finally, the temperature inside the furnace is slowly decreased further down to the room temperature under the same ambient atmosphere.

In the oxide superconductor obtained by the procedure described above, the CuO phase remains within the grain boundaries of the $RE_1Ba_2Cu_3O_{7-x}$, and this remaining CuO phase and the micro-defects introduced by the decomposition process function as the pinning centers to obstruct the movements of the magnetic fluxes entering into the superconductor due to the self-excitation at a time of current conduction through the superconductive layer, so that the critical current density of the superconductor can be improved.

Moreover, these CuO phase and micro-defects are obtained by utilizing the decomposition of the $RE_1Ba_2Cu_4O_8$ phase, so that they can be distributed uniformly over the entire superconductive layer, and consequently, the pinning effects due to the pinning centers can be obtained uniformly from the entire superconductive layer and it becomes possible to exhibit the effect of the improved critical current density efficiently.

Referring now to FIG. 3 to FIG. 6, one concrete example of an oxide superconductor and its manufacturing method according to the present invention will be described in detail.

In this example, the solution to be applied to the substrate was prepared by mixing powders of Y acetylacetone complex salt [Y(acac)$_3$] with 23% in weight of Y as the rare earth element, powders of Ba acetylacetone complex salt [Ba(acac)$_2$(OH$_2$)$_2$] with 41% in weight of Ba, and powders of Cu acetylacetone complex salt [Cu(acac)$_2$] with 23% in weight of Cu, at a mole ratio of Y: Ba: Cu=1: 2:3.5, and then dissolving the obtained mixture into the mixed organic solvent of the pyridine (Py) and the propionic acid (PA) with a weight percentage rate of PY: PA=5:3. Then, this solution was nearly completely evaporated, and dissolved again by adding methanol to obtain the uniform solution.

The uniform solution so obtained was then applied onto the (100) surface of the monocrystalline substrate of strontium titanate (SrTiO$_3$) by the spin coating method under the conditions of a rate of revolutions equal to 3000 rpm and an application time equal to 5 sec.

Then, the entire substrate with the solution applied thereon was confined in a muffle furnace, and calcined at the temperature of 600° C. in the air for ten minutes, so as to carry out the rapid thermal decomposition of the organic salts. The resulting calcined body comprises microscopic crystal grains in Y$_2$O$_3$-BaCO$_3$-CuO phase.

Then, the multi-stage heat treatment was applied to this calcined body in the furnace by appropriately controlling the temperature and the atmosphere inside the furnace according to the timing chart shown in FIG. 8, as follows.

First, in the argon gas atmosphere, the temperature inside the furnace was increased from the room temperature to 750° C. over the period of 80 minutes, and this temperature of 750° C. was maintained for the following 3 hours. Then, the temperature inside the furnace was maintained at 750° C. for further 15 hours while supplying the oxygen gas into the furnace. Then, after the atmosphere inside the furnace was replaced by that of the argon gas, the temperature inside the furnace was maintained at 750° C. for further 1 hour. Then, the temperature inside the furnace was maintained at 750° C. for further 30 minutes while supplying the oxygen gas into the furnace. Then, the temperature inside the furnace was slowly decreased to 450° C. over the period of 1 hour, and this temperature of 450° C. was maintained for the following 3 hours. Finally, the temperature inside the furnace was slowly decreased further down to the room temperature. As a result, the oxide superconductor with the thickness of the superconductive layer equal to 0.4 μm was obtained.

Figure 3:
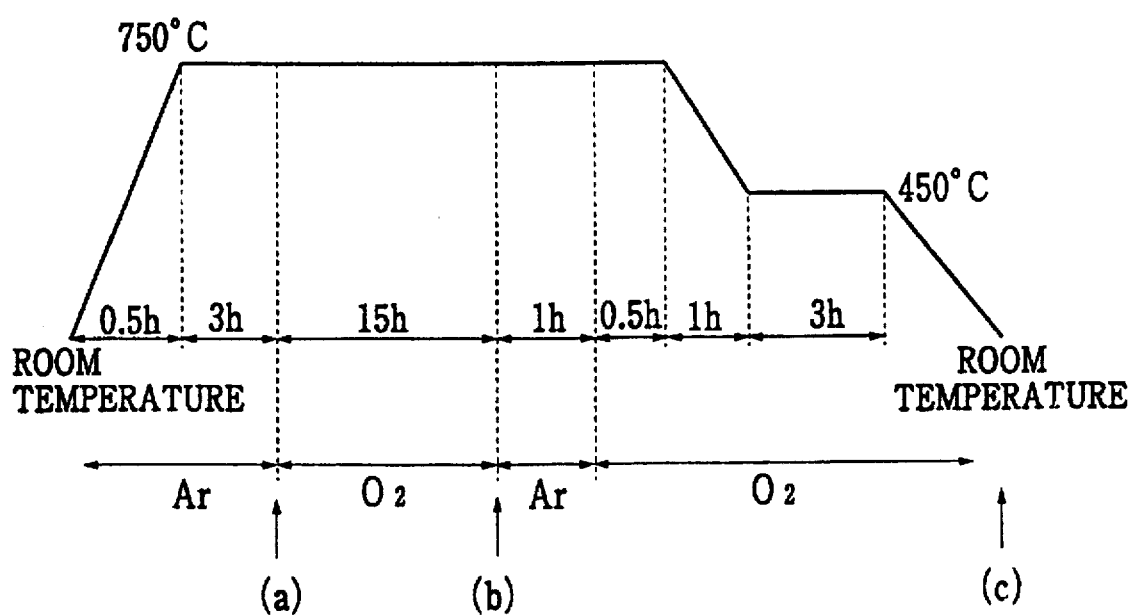
FIG. 3 is a timing chart for a multi-stage heat treatment used in one concrete example of the method of manufacturing an oxide superconductor according to the present invention.

During this manufacturing procedure, the samples were taken out of the furnace at the stages (a), (b), and (c) indicated in the timing chart of FIG. 3, and the compositions of the samples were analyzed by using the X-ray diffraction method. The results of these X-ray diffraction analyses are shown in FIG. 4.

Figure 4:
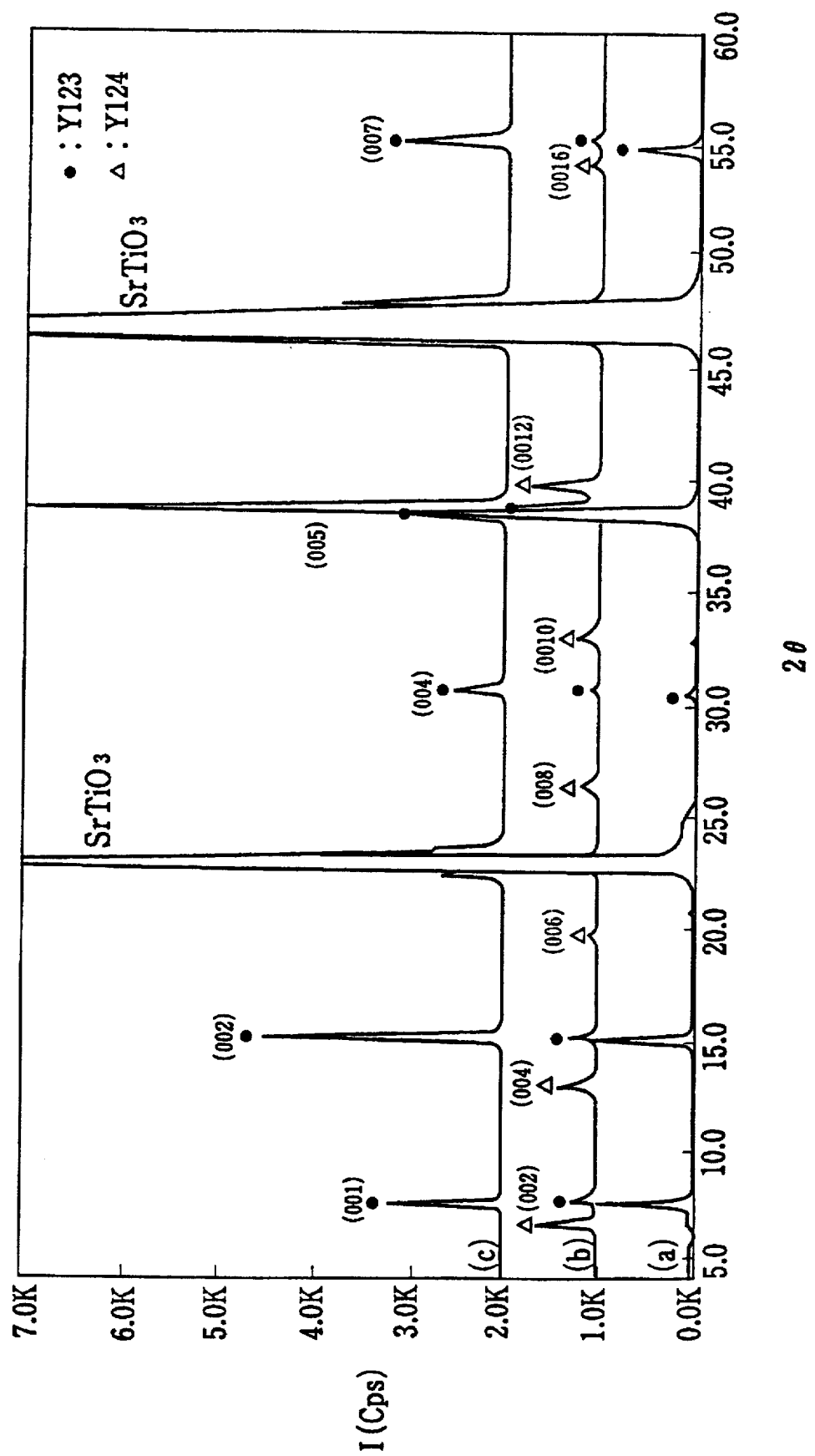
FIG. 4 is a graph showing results of X-ray diffraction analyses of oxide superconductor samples at three different stages in the multi-stage heat treatment of FIG. 3.

It can be clearly seen in FIG. 4 that, at the stage (a), the c-axis oriented $Y_1Ba_2Cu_3O_6$ phase is produced, while at the stage (b), the c-axis oriented $Y_1Ba_2Cu_4O_8$ phase is produced as the c-axis oriented $Y_1Ba_2Cu_3O_6$ phase and the CuO phase at the grain boundaries react with each other. Then, FIG. 4 also shows that, at the stage (c), the $Y_1Ba_2Cu_4O_8$ phase disappears while the $Y_1Ba_2Cu_3O_{7-x}$ phase appears, as a result of the thermal decomposition process of $Y_1Ba_2Cu_4O_8$ phase→$Y_1Ba_2Cu_3O_{7-x}$ phase+CuO phase carried out by the heat treatment under the argon gas atmosphere after the stage (b).

Figures 5, 6:
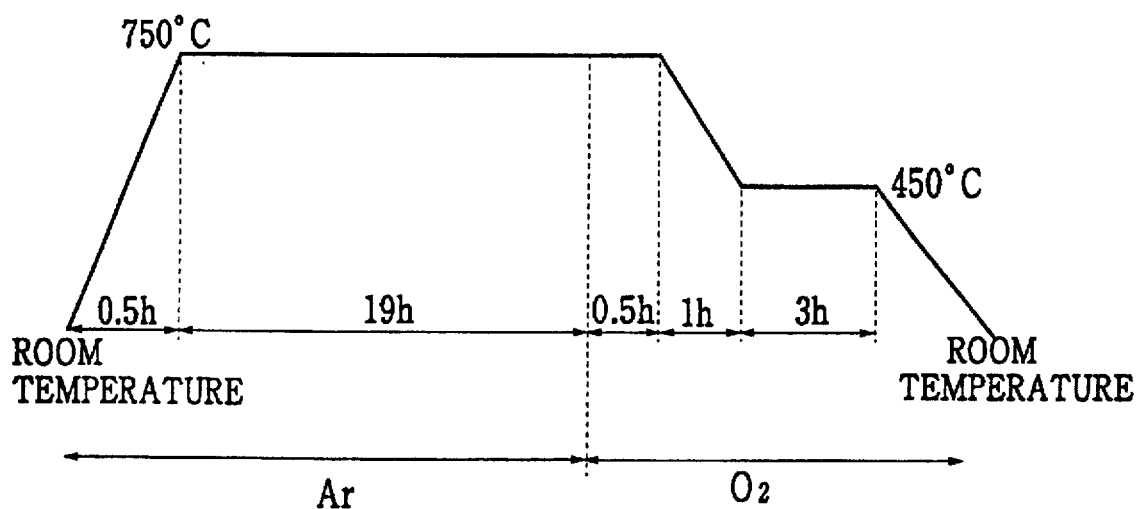
FIG. 5 is a timing chart for a multi-stage heat treatment used in a comparative example of a conventional method of manufacturing an oxide superconductor.
FIG. 6 is a table showing results of critical current density measurements for the oxide superconductor obtained by one concrete example of the manufacturing method of the present invention and the oxide superconductor obtained by a comparative example of a conventional manufacturing methods, at four different temperatures.

On the other hand, as a comparative example, a conventional manufacturing method for producing the $Y_1Ba_2Cu_3O_{7-x}$ phase directly, without using the intermediate $Y_1Ba_2Cu_4O_8$ phase, was also carried out, by using the multi-stage heat treatment according to the timing chart shown in FIG. 5. Here, first, in the argon gas atmosphere, the temperature inside the furnace was increased from the room temperature to 750° C. over the period of 30 minutes, and this temperature of 750° C. was maintained for the following 19 hours. Then, the temperature inside the furnace was maintained at 750° C. for further 30 minutes while supplying the oxygen gas into the furnace. Then, the temperature inside the furnace was slowly decreased to 450° C. over the period of 1 hour, and this temperature of 450° C. was maintained for the following 3 hours. Finally, the temperature inside the furnace was slowly decreased further down to the room temperature.

Then, the critical current densities of the oxide superconductor obtained by the above described example of the manufacturing method according to the present invention (sample 1) and the oxide superconductor obtained by the above described comparative example of the conventional manufacturing method (sample 2) were measured at various temperatures. The result of these critical current density measurements are summarized in the table of FIG. 6.

It can be clearly seen in FIG. 6 that, the oxide superconductor obtained by the manufacturing method of the present invention (sample 1) has the improved critical current density compared with the oxide superconductor obtained by the conventional manufacturing method (sample 2). In particular, at the temperature of 77 K, under 0 T (no external magnetic field), the sample 1 shows the critical current density Jc of 18000 A/cm$^2$, in contrast to the sample 2 which shows the critical current density Jc of only 2000 A/cm$^2$, so that the considerable improvement of the critical current density can be achieved by the present invention.

This considerable improvement of the critical current density in the present invention can be attributed to the pinning effect of the CuO phase and the micro-defects introduced by the decomposition process which function as the pinning centers to obstruct the movements of the magnetic fluxes entering into the superconductor due to the self-excitation at a time of current conduction through the superconductive layer.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method of manufacturing an oxide superconductor, comprising the steps of:
   (a) applying a solution containing organic compounds of a plurality of metallic elements for constituting an oxide superconductive layer with a composition of $RE_1Ba_2Cu_3O_{7-x}$ onto a substrate, wherein RE is a rare earth element selected from the group consisting of Y, Eu, Gd, Dy, Ho, Er and Yb;
   (b) calcining the substrate applied with the solution to obtain a calcined body in which the organic compounds contained in the solution are thermally decomposed;
   (c) heating the calcined body to produce a $RE_1Ba_2Cu_4O_8$ phase; and
   (d) decomposing the $RE_1Ba_2Cu_4O_8$ phase into a $RE_1Ba_2Cu_3O_{7-x}$ phase and a CuO phase, to obtain the oxide superconductor having the superconductive layer formed on the substrate, where the CuO phase and micro-defects caused by this decomposing step are introduced into the superconductive layer as pinning centers.

2. The method of claim 1, wherein at the step (a), a thickness of the solution applied onto the substrate is adjusted by controlling a viscosity of the solution and selecting a manner of application to obtain the oxide superconductor of a desired thickness at the step (d).

3. The method of claim 1, wherein at the step (b), the substrate applied with the solution is calcined at a temperature in a range of 500° to 700° C.

4. The method of claim 1, wherein the step (c) further comprises the steps of:
   (c1) heating the calcined body at a temperature and an ambient atmosphere corresponding to a thermodynamically stable region for the $RE_1Ba_2Cu_3O_{7-x}$ phase in a starting composition, to produce $RE_1Ba_2Cu_3O_6$ phase and the CuO phase; and
   (c2) further heating the $RE_1Ba_2Cu_3O_6$ phase and the CuO phase to produce the $RE_1Ba_2Cu_4O_6$ phase.

5. The method of claim 4, wherein at the step (c1), the calcined body is heated at the temperature in a range of 700° to 850° C. under the ambient atmosphere of inert gas having a negligibly low oxygen partial pressure.

6. The method of claim 4, wherein at the step (c1), the $RE_1Ba_2Cu_3O_6$ phase is produced to be c-axis oriented in a direction vertical with respect to the surface of the substrate, so as to obtain the c-axis oriented $RE_1Ba_2Cu_4O_8$ phase at the step (c2).

7. The method of claim 4, wherein at the step (c2), the $RE_1Ba_2Cu_3O_6$ phase and the CuO phase are further heated at a temperature and an ambient atmosphere corresponding to a thermodynamically stable region for the $RE_1Ba_2Cu_4O_8$ phase in a starting composition.

8. The method of claim 7, wherein at the step (c2), the $RE_1Ba_2Cu_3O_6$ phase and the CuO phase are further heated at the temperature in a range of 700° to 850° C. under the ambient atmosphere having an oxygen partial pressure greater than that of the ambient atmosphere at the step (c1).

9. The method of claim 1, wherein at the step (d), the $RE_1Ba_2Cu_4O_8$ phase is decomposed into the $RE_1Ba_2Cu_3O_{7-x}$ phase and the CuO phase by heating the $RE_1Ba_2Cu_4O_8$ phase at a temperature and an ambient atmosphere corresponding to a thermodynamically stable region for the $RE_1Ba_2Cu_3O_{7-x}$ phase in a starting composition.

10. The method of claim 9, wherein at the step (d), the $RE_1Ba_2Cu_4O_8$ phase is heated at the temperature in a range of 700° to 850° C. under the ambient atmosphere of inert gas having a negligibly low oxygen partial pressure.

11. The method of claim 9, wherein at the step (d), the $RE_1Ba_2Cu_4O_8$ phase is heated at a lowest temperature within the thermodynamically stable region for the $RE_1Ba_2Cu_3O_{7-x}$ phase in the starting composition.

12. The method of claim 1, further comprising the step of changing a crystal structure of a complex oxide having a composition of $RE_1Ba_2Cu_3O_{7-x}$ formed in the superconductive layer from a tetragonal structure to a rhombic structure.

13. The method of claim 1, wherein the steps (c) and (d) are realized by a multi-stage heat treatment comprising the steps of:

(e1) confining the calcined body obtained at the step (b) inside a furnace having an atmosphere of inert gas;

(e2) increasing a temperature inside the furnace from a room temperature to realize a temperature and an ambient atmosphere of the inert gas corresponding to a thermodynamically stable region for the $RE_1Ba_2Cu_3O_{7-x}$ phase in a starting composition, and maintaining the temperature and the ambient atmosphere, to produce the $RE_1Ba_2Cu_3O_6$ phase and the CuO phase;

(e3) heating the the $RE_1Ba_2Cu_3O_6$ phase and the CuO phase while supplying oxygen gas into the furnace to realize a temperature and an ambient atmosphere corresponding to a thermodynamically stable region for the $RE_1Ba_2Cu_4O_8$ phase in a starting composition, to produce the $RE_1Ba_2Cu_4O_8$ phase;

(e4) further heating the $RE_1Ba_2Cu_4O_8$ phase while supplying inert gas into the furnace to realize a temperature and an ambient atmosphere corresponding to a thermodynamically stable region for the $RE_1Ba_2Cu_3O_{7-x}$ phase in a starting composition, to decompose the $RE_1Ba_2Cu_4O_8$ phase into the $RE_1Ba_2Cu_3O_{7-x}$ phase and the CuO phase;

(e5) further heating the $RE_1Ba_2Cu_3O_{7-x}$ phase and the CuO phase while supplying oxygen gas into the furnace at a temperature in a range of 700° to 850° C. under the ambient atmosphere having a higher oxygen partial pressure, decreasing a temperature inside the furnace to a temperature in a range of 400° to 500° C., and maintaining the temperature inside the furnace at the temperature in a range of 400° to 500° C., to change a crystal structure of a complex oxide having a composition of $RE_1Ba_2Cu_3O_{7-x}$ formed in the superconductive layer from a tetragonal structure to a rhombic structure; and (e6) decreasing a temperature inside the furnace to the room temperature.

14. A method of manufacturing an oxide superconductor precursor, comprising:

(i) heating a layer on a substrate thereby producing a $RE_1Ba_2Cu_3O_6$ phase and a CuO phase on the substrate, wherein said layer comprises RE, Ba, Cu and O, RE is a rare earth element selected from the group consisting of Y, Eu, Gd, Dy, Ho, Er and Yb, and said $RE_1Ba_2Cu_3O_6$ phase is C-axis oriented in a direction vertical with respect to the surface of the substrate;

(ii) heating said $RE_1Ba_2Cu_3O_6$ phase and CuO phase on the substrate, thereby producing a C-axis oriented $RE_1Ba_2Cu_4O_8$ phase on the substrate.

* * * * *